US006861292B2

(12) United States Patent
Chiu

(10) Patent No.: US 6,861,292 B2
(45) Date of Patent: Mar. 1, 2005

(54) COMPOSITE LID FOR LAND GRID ARRAY (LGA) FLIP-CHIP PACKAGE ASSEMBLY

(75) Inventor: Tz-Cheng Chiu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/842,014

(22) Filed: May 10, 2004

(65) Prior Publication Data

US 2005/0026331 A1 Feb. 3, 2005

Related U.S. Application Data

(62) Division of application No. 10/631,130, filed on Jul. 31, 2003, now Pat. No. 6,784,535.

(51) Int. Cl.[7] .......................... H01L 21/44; H01L 23/12
(52) U.S. Cl. ........................ 438/121; 257/704; 257/710
(58) Field of Search ................ 438/118–123, 612–616; 257/700–705

(56) References Cited

U.S. PATENT DOCUMENTS 6,317,326 B1 * 11/2001 Vogel et al. ................. 361/704
6,665,187 B1 * 12/2003 Alcoe et al. ................. 361/719
2003/0042598 A1    3/2003 Crane et al.
2004/0036183 A1    2/2004 Im et al.

* cited by examiner

Primary Examiner—Matthew Smith
Assistant Examiner—Calvin Lee
(74) Attorney, Agent, or Firm—Wade James Brady, III; Frederick J. Telecky, Jr.

(57) ABSTRACT

A composite lid for a semiconductor package, in which the lid includes at least two materials. The first material is disposed over and attached to the back surface of the die with a low-modulus thermal gel, and the second material is disposed towards the perimeter of the lid. The second material has a modulus of elasticity greater than the modulus of elasticity of the first material, and preferable, at least twice that of the first material.

14 Claims, 4 Drawing Sheets

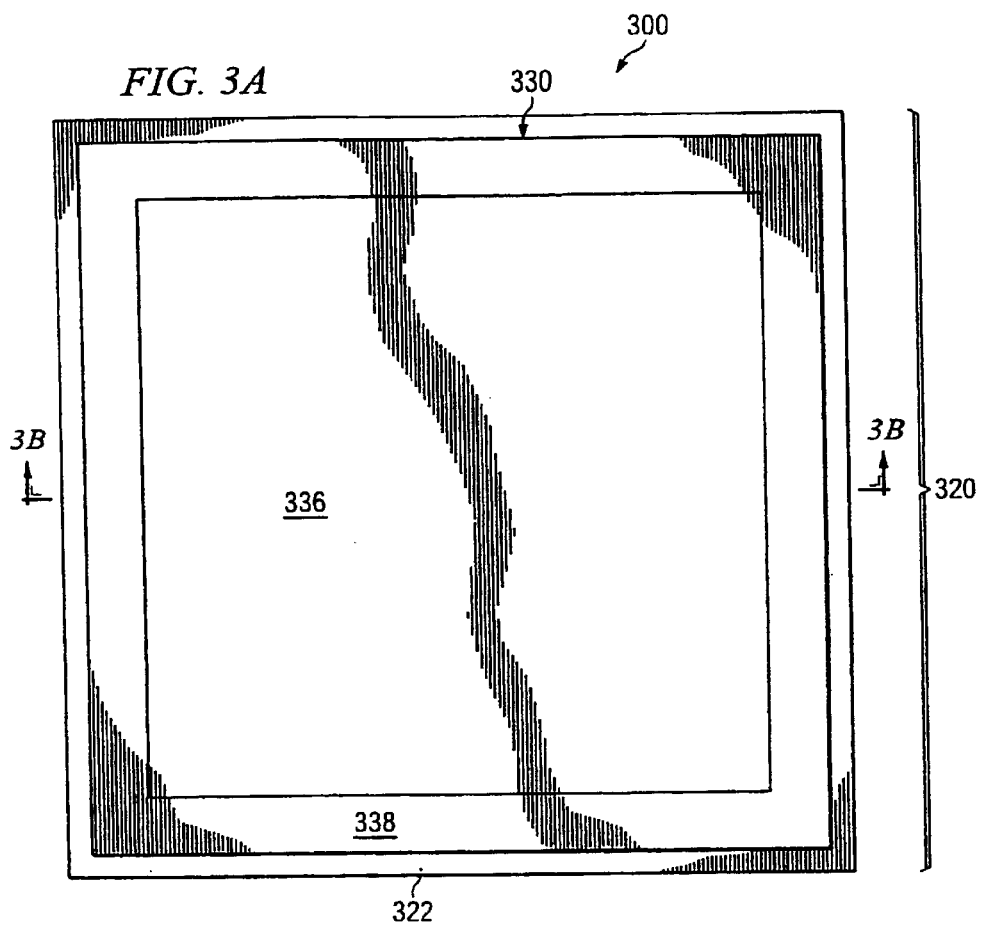
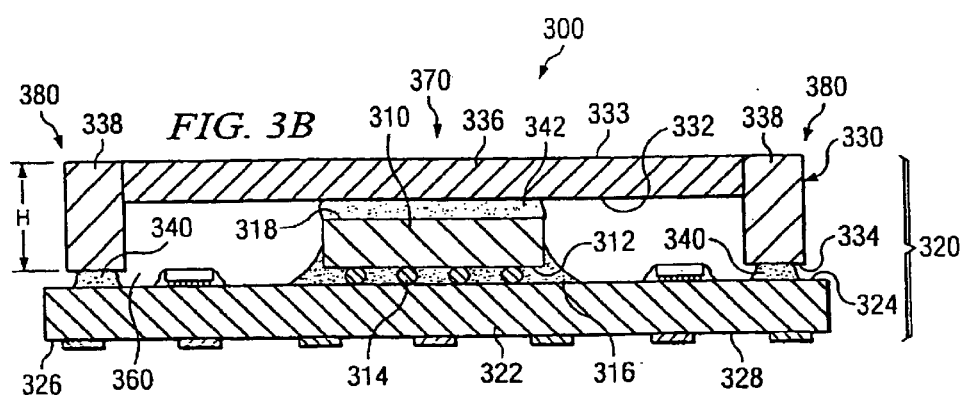

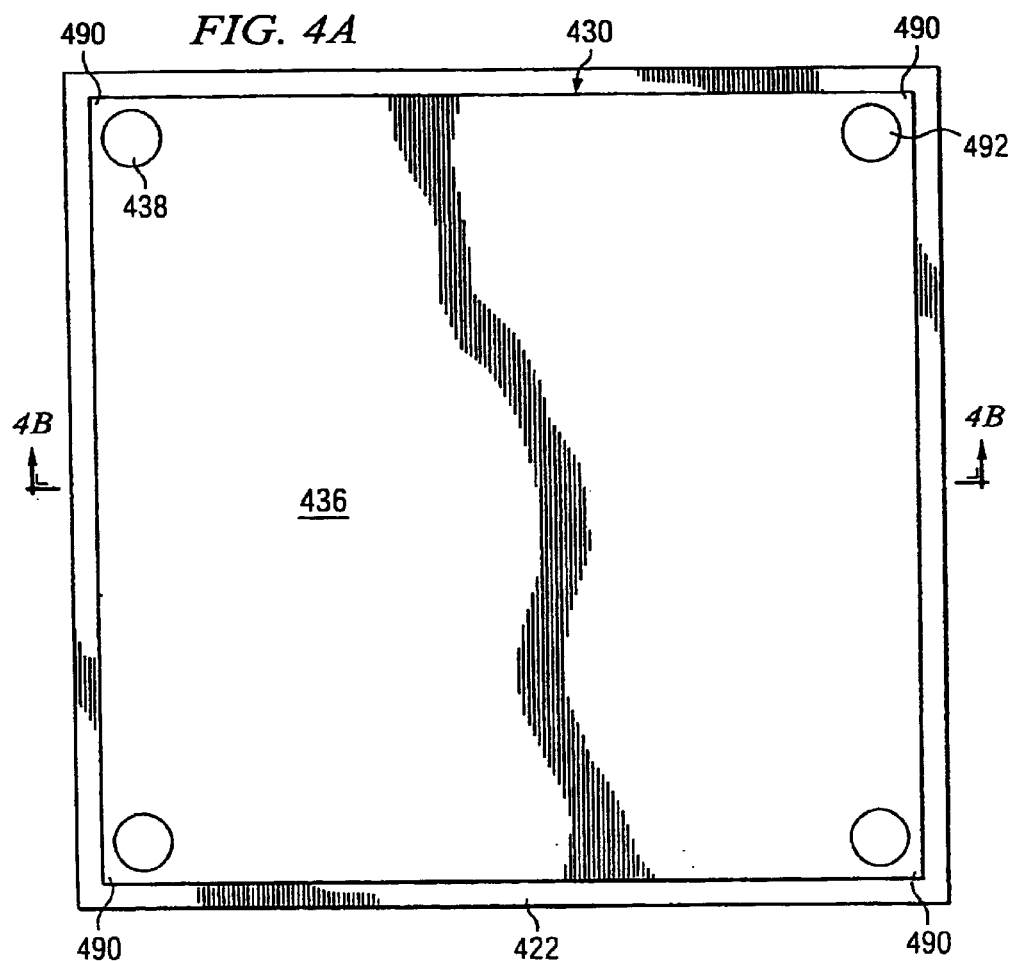
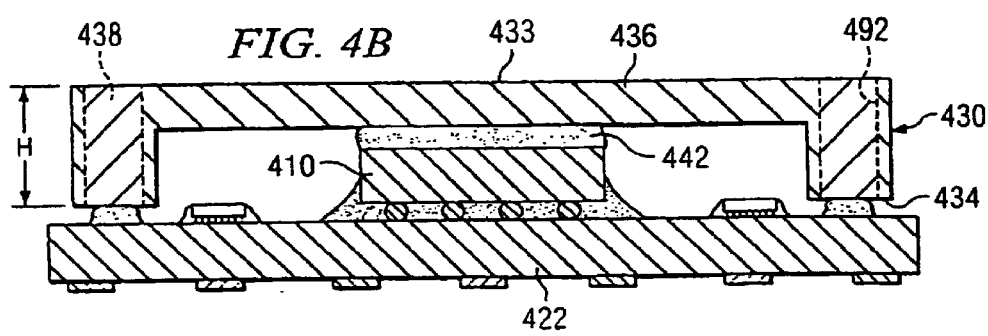

COMPOSITE LID FOR LAND GRID ARRAY (LGA) FLIP-CHIP PACKAGE ASSEMBLY

This application is a division of Ser. No. 10/631,130, filed Jul. 31, 2003 now U.S. Pat. No. 6,784,535.

BACKGROUND OF THE INVENTION

Integrated circuits are fabricated on the surface of a semiconductor wafer in layers and later singulated into individual semiconductor devices, or "dies." Many fabrication processes are repeated numerous times, constructing layer after layer until fabrication is complete. Metal layers, which typically increase in number as device complexity increases, include patterns of conductive material that are vertically insulated from one another by alternating layers of insulating material. Conductive traces are also separated within each layer by an insulating, or dielectric, material. Vertical, conductive tunnels called "vias" typically pass through insulating layers to form conductive pathways between adjacent conductive patterns. Since the material of a semiconductor wafer—commonly silicon—tends to be relatively fragile and brittle, dies are often assembled into protective housings, or "packages," before they are interconnected with a printed circuit board (PCB).

The land grid array (LGA) package is a semiconductor package wherein a die is mounted on a package substrate and enclosed by a rigid lid typically comprised of a homogenous material. The LGA package is so named because the substrate has an array of circular electrical contact pads, or "lands," arranged in a grid pattern on its underside. The lands are brought into electrical contact with the PCB generally by a socket having polymer interposers, metal springs or other electrically conductive element for contacting both the lands and the appropriate conductive portions of the PCB below. The LGA package is generally held in compression with the PCB by a socket, ensuring effective interconnections are maintained between the package and PCB. The die is usually connected to the substrate by a wirebonding, tape-automated bonding (TAB), or flip-chip interconnection process.

Flip-chip interconnect technology supports "area array interconnection," a technology in which the die (or "chip") can be mechanically and electrically connected to a substrate or board through an array of solder bumps on the active face of the die. As the entire active face of the die (and not just the periphery) can be used for interconnections, this technique increases the number of connections that can be made for a given die size. The die is affixed to the substrate facedown (or "flipped") by slightly melting the solder bumps in an oven reflow process, attaching them to the substrate. The solder bump area is often reinforced by introducing an epoxy underfill between the die and the substrate in order to improve solder joint reliability. Electrical performance can also be improved by reducing inductance and capacitance, as a result of the reduced distance between the active surface of the die and the underlying board over non-flip-hip configurations.

Referring now to FIGS. 1A and 1B, a packaged semiconductor device 100 is shown as including a die 110 packaged in an LGA package 120. In the cross-sectional side view shown in FIG. 1B, the die 110 is oriented with its active (or "top") surface 112 facing down towards the package substrate 122, in a flip-chip configuration. Solder bumps 114 arranged on the active surface 112 of the die 110 are generally attached to the upper surface 124 of the substrate 122 by an oven reflow process. The lower surface 126 of the substrate 122 is populated with a grid array of electrical contact lands 128.

After the die 110 is attached to the substrate 122, an underfill material 116 may be injected under the die and around solder bumps 114 to improve the reliability of these joints. Chip capacitors 150 are commonly attached to the substrate 122 in a similar manner. A lid attach material 140, such as an epoxy or silicone, is applied to the back surface 118 of the die 110 as well as around the perimeter of the upper surface 124 of substrate 122. A rigid lid 130 in the shape of an open-ended box is then positioned open-side-down over the substrate 122, such that the inside surface 132 of the lid contacts the lid attach 140 on the inactive die surface 118. The perimeter edges 134 of the lid 130 contact the lid attach 140 on the upper surface 124 of the substrate 122, thereby forming a substantially sealed cavity 160 around the die. It should be noted that the package 120 includes the substrate 122 and lid 130, whereas the packaged semiconductor device 100 includes both the package 120 and all its constituent components, as well as the die(s) 110 mounted within the package.

When an LGA package is inserted in a socket for testing or mounting to a PCB board, the package is generally under a high compressive load. The high compressive force is required to ensure reliable electrical contact between the LGA pad and the interposer polymer-column or metal-spring bumps typically used as interconnects between the substrate and the PCB. The compressive force on an LGA package may be between 250–500 pounds (Ibf) for a typical 1500-pin package, which may only be about 4 cm×4 cm in footprint area. Single-cavity-lid flip-chip assembly techniques, such as the aforementioned LGA assembly, can result in high stresses in the comparatively small die.

Referring now to FIG. 2, an exemplary LGA assembly 200 is shown in a cross-sectional view illustrating how an LGA package 120 is typically attached to a PCB 202. The LGA package 120 is interconnected with the PCB 202 by an interposer structure 210, which may include springs 212 for contacting lands on the LGA substrate 122. Compression forces maintain the connection between the package 120 and the PCB 202. A heatsink 220 is typically mounted above the package lid 130 and secured to the PCB 202 by rods 230 passing through the heatsink and PCB. The bottom ends of rods can be secured in a backing plate 240 underneath a support plate 250 on the bottom of the PCB 202. Compression forces on the package 120 can be varied by adjusting variable-stiffniess springs 260 positioned above the heatsink.

In flip-chip LGA assembly, much of the compression force applied to the package tends to travel through the die, since it is generally in the center of the package and LGA assembly. Stresses within the die can lead to cracking of metallization within the die, as well as to the insulating dielectric structures positioned between the metal layers. Commonly used low-k dielectric structures may include materials with a relatively low cohesive strength, such as porous organosilicate glass (OSG). Such low-k dielectrics are used as both inter-level dielectrics (e.g., between metal layers) and inter-metal dielectrics (e.g., between metal structures within the same layer). This class of materials can have a low cohesive strength compared to adjacent metal structures, and consequently may be especially susceptible to damage from mechanical forces. Accordingly, it is preferable to distribute forces applied to the package lid to the outer edges of the lid, away from the fragile die.

Common LGA lids are homogenous structure, or composed of a single material, such as copper-tungsten (CuW).

As shown by the approximate values displayed in Table 1 below, CuW has a very similar coefficient of thermal expansion (CTE) to that of alumina (Al$_2$O$_3$), a material commonly used in ceramic LGA packages. A goal in packaging technology is to design packages such that the interfaces of adjacent materials do not have significantly different CTE's. As temperature variances would cause a high-CTE material to expand or contract more than a lower-CTE material, the two materials would tend to pull away from one another, or delaminate, at the common interface.

TABLE 1

Material Properties

|  | Modulus of Elasticity (GPa) | CTE (ppm/° C.) | Thermal Conductivity, k (W/mK) |
|---|---|---|---|
| Cu-87% W | 300 | 6.5 | 180 |
| Cu | 110–127 | 16–17 | 391–398 |
| W | 407–410 | 4.5 | 170–178 |
| Si | 129–187* | 2.5–3.0 | 141 |
| Al$_2$O$_3$ | 386–393 | 6.5–7.6 | 35–39 |

*Directionally dependent on alignment of Si crystals

Although the CTE values of a copper-tungsten lid (~6.5 ppm/° C.) and an alumina substrate (~6.7 ppm/° C.) are similar, the thermal conductivity (k) of copper-tungsten is relatively moderate. A lid incorporating an area of relatively high-thermal-conductivity material over the die would allow greater heat dissipation from the die. In addition, the homogeneous copper-tungsten lid would contribute to high stresses in the silicon die under the LGA compressive loads, an undesirable trait when used over a fragile die.

It is desired to devise an LGA package lid allowing greater heat dissipation and reduced deformation under an applied load than conventional designs, while maintaining a similar CTE to that of the package substrate. Preferably, an improved LGA package design will distribute applied loads more effectively, such that loads applied to the LGA lid are transferred to the underlying structure primarily through the perimeter edges of the lid, and less through the die itself.

BRIEF SUMMARY OF THE INVENTION

Disclosed are a composite lid for a semiconductor package and a method for assembling the composite lid into a packaged semiconductor device. The composite lid includes a plurality of materials, with a first material disposed over and attached to the back surface of the die with a low-modulus thermal gel and a second material disposed towards the perimeter of the lid. The second material has a modulus of elasticity greater than the modulus of elasticity of the first material, and preferably, at least twice that of the first material.

In a preferred embodiment, the first material is disposed in the central area of the composite lid, and the second material is disposed in the perimeter areas of the lid, extending substantially throughout the height of the lid. In an alternative embodiment, the first material is disposed in the central area of the composite lid, and the second material is disposed in the corner areas of the lid, extending substantially throughout the height of the lid. In a typical configuration, the die is a bumped flip-chip die interconnected to an LGA package substrate.

BRIEF DESCRIPTION OF THE DRAWINGS

For a detailed description of the preferred embodiments of the invention, reference will now be made to the accompanying drawings in which:

FIG. 3A is a top view of a preferred embodiment of an LGA package;

FIG. 3B is a cross-sectional view of FIG. 3A;

FIG. 4A is a top view of an alternative embodiment of an LGA package; and

FIG. 4B is a cross-sectional view of FIG. 4A.

NOTATION AND NOMENCLATURE

Figure 1A:
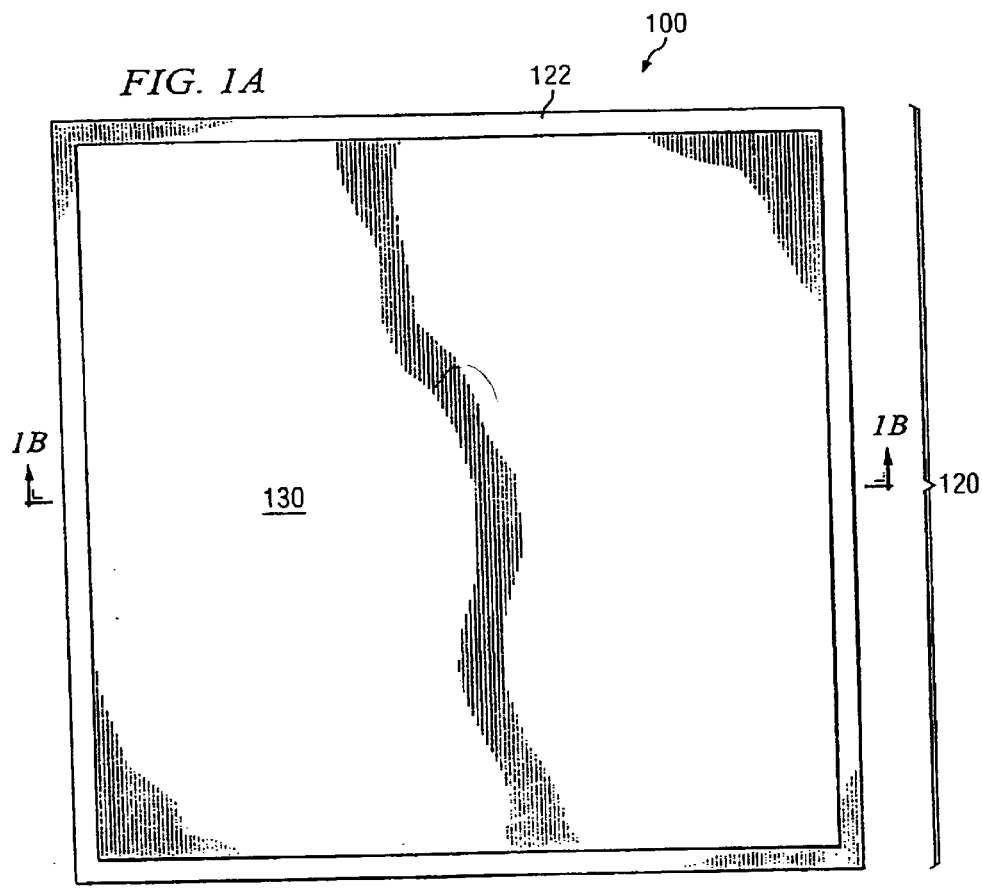
FIG. 1A is a top view of an exemplary land grid array (LGA) package.
Figure 1B:
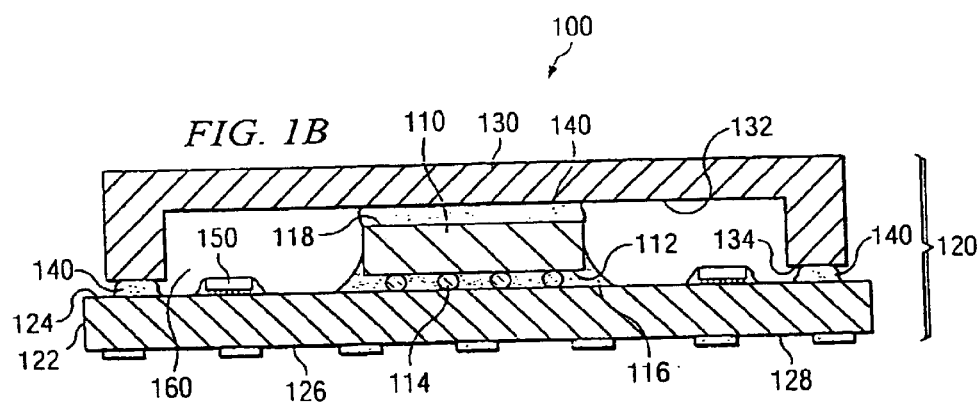
FIG. 1B is a cross-sectional view of FIG. 1A.
Figure 2:
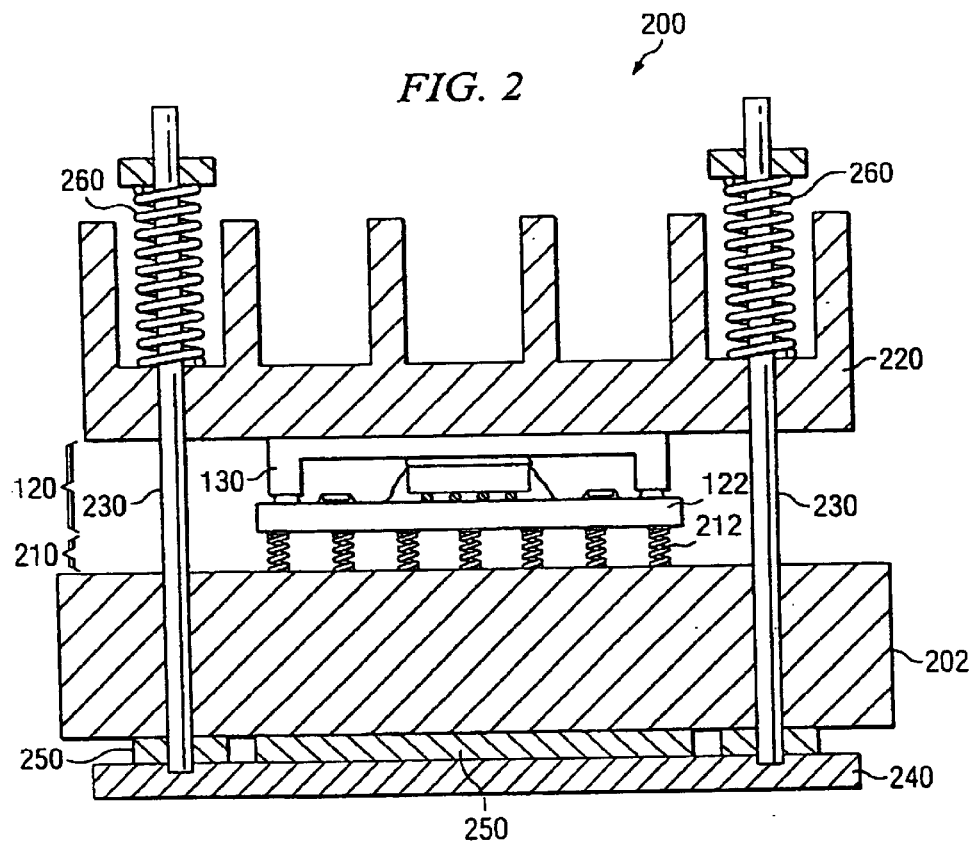
FIG. 2 is a cross-sectional view of an exemplary LGA socket assembly.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct connection. Thus, if a first device couples to a second device, that connection may be through a direct connection, or through an indirect connection via other devices and connections.

The term "integrated circuit" refers to a set of electronic components and their interconnections (internal electrical circuit elements, collectively) that are patterned on the surface of a microchip. The term "semiconductor device" refers generically to an integrated circuit (IC). The term "die" ("dies" for plural) refers generically to an integrated circuit, in various stages of completion, including the underlying semiconductor substrate and all circuitry patterned thereon. The term "wafer" refers to a generally round, single-crystal semiconductor substrate upon which integrated circuits are fabricated in the form of dies. The term "interconnect" refers to a physical connection providing possible electrical communication between the connected items. The term "bumped die" is used herein to indicate an integrated circuit die with controlled collapse chip connection (C4) or current state-of-the-art conductive bumps patterned thereon, for interconnection with a substrate, printed circuit board or other electrical component. The term "flip chip" refers to such a bumped die, which is designed for a face-down direct interconnection with an underlying electrical component through the C4 or bumped connection. The terms "direct interconnection" and "directly connected" are used herein to indicate an interconnection wherein the active face of a die is positioned adjacent to the surface with which the die is electrically interconnected, with or without any interstitial components.

The term "semiconductor package" refers generically to the components for encapsulating and interconnecting a die to a printed circuit board, and is used herein to include an LGA substrate and lid. The term "packaged semiconductor device" refers to a die mounted within a package, as well as all package constituent components. The term "composite" is used herein to refer to a structure including more than one material not manually separable from one another. To the extent that any term is not specially defined in this specification, the intent is that the term is to be given its plain and ordinary meaning.

DETAILED DESCRIPTION OF THE PREFERRED EMBODIMENTS

Referring now to FIGS. 3A and 3B, a packaged semiconductor device 300 is shown in top and cross-sectional views, respectively. Packaged semiconductor device 300 includes a die 310 packaged in an LGA package 320. A rigid composite lid 330 in the shape of an open-ended box is disposed over the substrate 322. As shown in FIG. 3B, the die 310 is oriented with its active surface 312 facing down towards the package substrate 322, in a flip-chip configuration. Solder bumps 314 arranged on the active surface 312 of the die 310 attach the die to the upper surface 324 of the substrate 322. The lower surface 326 of the substrate 322 is populated with a grid array of electrical contact lands 328.

An underfill material 316 may be inserted under the die and around solder bumps 314 to improve the reliability of these joints. A lid attach compound 340, such as an epoxy or silicone, is applied around the perimeter of the upper surface 324 of substrate 322, generally in the corners of the substrate. A low-modulus thermal compound 342, which may be a gel or silicone, is applied to the back surface 318 of the die 310. The perimeter edges 334 of the lid 330 contact the attach compound 340 on the substrate 322, and the inside surface 332 of the lid contacts the thermal compound 342 on the die 310, thereby forming a partially sealed cavity 360 around the die.

The thermal compound 342 is comprised of a high-thermal-conductivity viscous phase-change material, such as the gel marketed under the trade name Hi-Flow® 225U by The Bergquist Company. Preferably, the modulus of elasticity of the thermal gel is less than about 0.03 GPa, in order to decouple the relatively high-CTE lid from the silicon die, which has a comparatively low CTE. While attaching the die to the lid, the low modulus of the thermal compound limits the amount of thermal expansion that can be transferred from the comparatively thermally expansive lid to the die. The thermal gel may be used to reduce delamination and material cracking issues arising from the CTE mismatch between a high-CTE copper lid (~17 ppm/° C.) and the adjacent low-CTE silicon die (2.5–3 ppm/° C.).

In a preferred embodiment, as shown in FIGS. 3A and 3B, the composite lid 330 is comprised of at least two materials. A first material 336 is disposed in the central area 370 of the lid adjacent to the die. A second material 338 is disposed adjacent to the first material 336 and comprises the perimeter 380 of the lid 330, extending substantially throughout the height H of the lid. The second material 338 may comprise the entire perimeter area of the lid 330, extending from the lower perimeter edges 334 of the lid to the upper surface 333 of the lid, with the first material 336 comprising the section of the lid enclosed within this area, as shown in the top view of FIG. 3A.

The first lid material 336 has a modulus of elasticity lower than that of the second material 338, and more preferably has a modulus of elasticity less than half of the modulus of elasticity of the second material. The higher modulus of the second lid material 338 results in a non-uniform pressure condition at the interface between the heatsink 220 and lid 330 interface such that most of the socket compressive stress is directed to the substrate 322 without stressing the die 310. The first material 336 preferably has a thermal conductivity of at least about 250 Watts per meter Kelvin (W/mK). The relatively high thermal conductivity helps the composite lid 330 to remove heat from the die more effectively, spreading it along the upper lid surface 333, so that it may be more effectively removed by an LGA assembly heatsink. The second material 338 preferably has a coefficient of thermal expansion (CTE) of between about 4 parts per million per degree Celsius (ppm/° C.) and about 8 ppm/° C. This low CTE is similar to that of an alumina substrate and helps contain the thermal expansion experienced by the more expansive first material. A lid comprised of only the first material may have too great a CTE to be mated to an alumina substrate, as the lid could expand much more than the substrate, potentially weakening a connection between the two components.

When packaged with a silicon die as shown in the preferred embodiment, the first material 336 is preferably copper (Cu), due to its high thermal conductivity (about 398 W/mK) and lower modulus (about 110–127 GPa). The modulus of elasticity for copper (110–127 GPa) is similar to that of silicon (129–187, depending on the silicon crystal orientation), so the first material 336 and the adjacent die 310 will have relatively similar resistance to deformation from applied loads. It will be understood that other high-thermal-conductivity, low-modulus materials, such as aluminum (thermal conductivity 250 W/mK, modulus 70 GPa), may be used without departing from the spirit of the invention. As previously mentioned, a first material 336 with a relatively high thermal conductivity can contribute to greater heat dissipation from the die 310 to a neighboring heatsink (not shown in FIG. 3B) and to the ambient environment. Less commonly, a die is fabricated from material other than silicon. In such cases, it would be preferable to select a first material with a relatively high thermal conductivity and a modulus of elasticity similar to that of the die material used.

In the preferred embodiment, the second material is preferably copper-tungsten (Cu-87% W) or tungsten (W). Alumina, with a modulus of elasticity of about 386 GPa, is commonly used for LGA substrates. Copper-tungsten and tungsten both have a relatively high modulus of elasticity, of about 300 GPa and about 410 GPa, respectively. Copper-tungsten and tungsten also have relatively low CTE's, of about 6.5 ppm/° C. and about 4.5 ppm/° C., respectively. The values for modulus of elasticity and CTE for copper-tungsten and tungsten are about 386–393 GPa and 6.5–7.6 ppm/° C., respectively, similar to those of alumina (a common ceramic LGA substrate). Preferably, the second material has a CTE within +/-3 ppm/° C. of the CTE of the substrate.

In the preferred embodiment, the second material 338 is attached to the substrate, as shown in FIG. 3B. Consequently, it is preferred that the second material 338 have material properties similar to those of the substrate material used. Placing the high-modulus second material outside of the low-modulus first material allows applied loads to be distributed outward to the package perimeter with relatively little deformation in the first material. It will be understood that other high-modulus materials, such as silicon carbide (SiC), may be used without departing from the spirit of the invention.

Referring now to FIGS. 4A and 4B, in an alternative embodiment, the composite lid 430 is comprised of at least two materials. The first material 436 comprises the body of the lid 430 adjacent to the die 410. The second material 438 extends through the first material 436 substantially though the height H of the lid 430 near the lid corners 490, areas subject to particularly high stress and physical damage due to their discontinuous shapes. In the alternative embodiment, the second material 438 is configured as vertical cylinders 492 passing entirely through the lid 430, from the upper surface 433 of the lid 430 to the lower perimeter edges 434. As with the preferred embodiment, the first material 436 of the alternative embodiment is preferably a low-modulus material with a high thermal conductivity, such as copper or aluminum. The second material 438 is preferably a high-modulus material with a low CTE, such as copper-tungsten, tungsten or silicon carbide. A silicon die is attached to the first material 436 of the lid 430 with a low-modulus thermal compound 442.

The composite lid of the preferred embodiments may be formed by several methods. The first and second materials may be bonded to one another by a sintering process, wherein the dissimilar materials are packed into a mold in powder form under high compacting pressure and exposed to high temperatures, thereby forming a cohesive solid. Another manufacturing method involves a diffusion bonding process, in which the lid is formed by holding pre-machined components under load at an elevated temperature, usually in a protective atmosphere or vacuum. Still another manufacturing method involves a shrink fit process, in which the lid is formed by heating an outer component (e.g., the second material) into a state of expansion. The heated component is then placed over or around another component (e.g., the first material), such that the two materials are joined when the heated material cools and contracts and forms a "shrink fit" around the inner component. Several other methods of forming a composite lid may be used without departing from the spirit of the invention.

When mounted to a PCB, compressive loads are generally applied to the top and bottom surfaces of an LGA package. The embodiments shown position the second material outside of the first material, such that the low-modulus first material can transfer surface loading forces to the perimeter of the package, where the applied load is less dangerous to the fragile die. Other alternative embodiments may include a plurality of materials with a discontinuous gradient of materials, such that materials with ensuingly higher moduli are disposed towards the perimeter of the lid. Alternatively, the entire corner portions may be comprised of the second material. Yet another design involves a composite lid sintered together, such that no clear boundary exists between the different materials, although the respective materials could be disposed within the mold at the locations in which they are most beneficial.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method of assembling a semiconductor die in a package, the method comprising the steps of:
   providing a semiconductor die having an active surface and a package substrate;
   interconnecting the an active surface of the die with the package substrate;
   applying an attach compound to a perimeter of the package substrate;
   applying a low-modulus thermal compound to a back surface of the die; and
   bonding a composite lid to the substrate and the back surface of the die, wherein the lid comprises a first material and a second material, the second material more elastic than the first material and secured to the substrate.

2. The method of claim 1, wherein:
   the first material is bonded to the die; and
   the second material is disposed towards a perimeter of the lid and bonded to the substrate.

3. A method of assembling a semiconductor die in a package, the method comprising:
   interconnecting an active surface of the die with a package substrate;
   applying an attach compound to a perimeter of the package substrate;
   applying a low-modulus thermal compound to a back surface of the die; and
   bonding a composite lid to the substrate and the back surface of the die, wherein the lid comprises a first material and a second material;
   the first material bonded to the die and the second material disposed toward a perimeter of the lid and bonded to the substrate;
   the second material having a modulus of elasticity greater than the modulus of elasticity of the first material.

4. The method of claim 3, wherein the second material extends throughout the height of the lid.

5. The method of claim 3, wherein the package substrate is comprised of alumina.

6. The method of claim 5, wherein the first material is a material selected from a group consisting of copper and aluminum.

7. The method of claim 6, wherein the second material is a material selected from a group consisting of copper-tungsten (Cu-87% W), tungsten and silicon carbide.

8. The method of claim 7, wherein the thermal compound has a modulus of less than 0.03 GPa.

9. A packaged semiconductor device comprising:
   an integrated circuit die having a bumped active surface and a back surface; and
   a semiconductor package comprising:
      a package substrate, the active surface of the die directly interconnected with the package substrate; and
      a composite lid comprising at least two materials, wherein the back surface of the die is attached to the lid, the second material more elastic than the first material and secured to the substrate.

10. The packaged semiconductor device of claim 9, wherein the package is a land grid array (LGA) package.

11. A packaged semiconductor device comprising:
    an integrated circuit die including a bumped active surface and a back surface; and
    a semiconductor land grid array (LGA) package comprising:
       a package substrate, the active surface of the die directly interconnected with the package substrate; and
       a composite lid comprising at least two materials, the back surface of the die attached to the lid;
       the composite lid comprising:
          a first material; and
          a second material, the modulus of elasticity of the first material being less than the modulus of elasticity of the second material.

12. The packaged semiconductor device of claim 11, wherein the modulus of elasticity of the first material is less than half the modulus of elasticity of the second material.

13. The packaged semiconductor device of claim 11, wherein the first material comprises the area of the lid adjacent to the die, and wherein the second material is disposed near the perimeter of the lid and extends substantially throughout the height of the lid.

14. The packaged semiconductor device of claim 11, wherein the die is attached to the first material by a thermal compound having a modulus of elasticity less that about 0.03 GPa.

* * * * *